(12) United States Patent  
Schanze et al.

(10) Patent No.: US 7,928,278 B2
(45) Date of Patent: Apr. 19, 2011

(54) METHOD AND APPARATUS FOR PRODUCING NEAR-INFRARED RADIATION

(75) Inventors: Kirk S. Schanze, Gainesville, FL (US); John R. Reynolds, Gainesville, FL (US); James M. Boncella, Gainesville, FL (US); Paul H. Holloway, Gainesville, FL (US); Benjamin Scott Harrison, Cantonment, FL (US); Tim Foley, Gainesville, FL (US); Sriram Ramakrishnan, Bangalore (IN)

(73) Assignee: University of Florida Research Foundation, Inc., Gainesville, FL (US)

( * ) Notice: Subject to any disclaimer, the term of this patent is extended or adjusted under 35 U.S.C. 154(b) by 2735 days.

(21) Appl. No.: 10/170,942

(22) Filed: Jun. 12, 2002

(65) Prior Publication Data

US 2002/0197050 A1   Dec. 26, 2002

Related U.S. Application Data

(60) Provisional application No. 60/297,580, filed on Jun. 12, 2001.

(51) Int. Cl.
*A61F 13/00* (2006.01)

(52) U.S. Cl. .......................................... 602/41; 602/42

(58) Field of Classification Search ............... 602/41–56; 522/17–18; 427/7–8
See application file for complete search history.

(56) References Cited

U.S. PATENT DOCUMENTS 5,475,104 A * 12/1995 Sessler et al. ................. 540/472
5,614,168 A *  3/1997 Berg et al. ..................... 424/9.42
6,153,775 A * 11/2000 Schroder et al. ................ 556/1
6,265,459 B1 *  7/2001 Mahoney et al. ............... 522/17

(Continued)

FOREIGN PATENT DOCUMENTS

EP    0915143    5/1999

(Continued)

OTHER PUBLICATIONS

Cleave et al., "Transfer Processes in Semiconducting Polymer-Porphyrin Blends," Advanced Materials, 13:44-47, 2001.

(Continued)

*Primary Examiner* — Michael A. Brown
(74) *Attorney, Agent, or Firm* — Thomas, Kayden, Horstemeyer & Risley, LLP

(57) ABSTRACT

The subject invention pertains to a method, apparatus, and composition of matter for producing near-infrared (near-IR) radiation. The subject invention can incorporate a polymer and a metal-containing compound, wherein the metal-containing compound can incorporate a metal-ligand complex, wherein when the metal-ligand complex becomes excited, energy is transferred from the ligand to the metal, wherein, the energy transferred to the metal by sensitization is emitted as near-infrared radiation. In a specific embodiment, the subject invention relates to a composition of matter having a luminescent polymer and a metal containing compound where the metal containing compound incorporates a metal-ligand complex such that the absorption spectrum of the metal-ligand complex at least partially overlaps with the emission spectrum of the luminescent polymer. As the absorption spectrum of the metal-ligand complex at least partially overlaps with the emission spectrum of the luminescent polymer, when the luminescent polymer becomes electronically excited energy can be transferred from the luminescent polymer to the metal-ligand complex. At least a portion of the energy transferred from the luminescent polymer to the metal-ligand complex can then be emitted by the metal-ligand complex as near-infrared radiation. The subject invention can incorporate polymers which are conjugated or non-conjugated and luminescent or non-luminescent. In a specific embodiment, conjugated polymers which are luminescent can be utilized.

76 Claims, 6 Drawing Sheets

PPP

U.S. PATENT DOCUMENTS

| | | | |
|---|---|---|---|
| 6,593,688 B2 * | 7/2003 | Park et al. | 313/504 |
| 6,610,351 B2 * | 8/2003 | Shchegolikhin et al. | 427/7 |
| 2001/0030325 A1 * | 10/2001 | Epstein et al. | 257/79 |

FOREIGN PATENT DOCUMENTS

| | | |
|---|---|---|
| WO | WO 0064996 | 11/2000 |

OTHER PUBLICATIONS

Martarano et al., "Luminescence of Yttrium (III), Lutetium (III), and Thorium (IV) Porphyrin Complexes," J. Phys. Chem., 80:2389-2393, 1976.

Zhang et al., "A novel ethacrynic acid sensor based on a lanthanide porphyrin complex in a PVC matrix," Analyst, The Royal Society of Chemistry, 125:867-870, 2000.

Koppe et al., "$Er^{3+}$—emission from organic complexes embedded in thin polymer films," Synthetic Metals, 121:1511-1512, 2001.

Harrison, Benjamin S. et al., "Near-infrared electroluminscence from conjugated polymer/lanthanide porphyrin blends" (Dec. 3, 2001) 3770-3772, vol. 79, No. 23.

McGehee, Michael D. et al. "Narrow Bandwidth Luminescence from Blends with Energy Transfer from Semiconducting Conjugated Polymers to Europium Complexes" Advanced Materials (1999) 1349-1354, vol. 11, No. 16.

Kido, Junji and Yoshi Okamoto "Organo Lanthanide Metal Complexes for Electroluminescent Materials" American Chemical Society (Nov. 21, 2001) 12 pages.

Klink, S.I. et al. "Sensitized near-infrared luminescence from polydentate triphenylene-functionalized $Nd^{3+}$, $Yb^{3+}$, and $Er^{3+}$ complexes" Journal of Applied Physics (Aug. 1, 1999) vol. 86, No. 3, 1181-1185.

Kawamura, Yuichiro et al. "Near-Infrared Photoluminescence and Electroluminiscence of Neodymium (III), Erbium (III), and Ytterbium (III) Complexes" Jpn. J. Appl. Phys. (Jan. 2001) vol. 40, 350-356.

Curry, R.J. and Gillin, W.P. "Infra-red and visible electroluminescence from ErQ based OLEDs" Syunthetic Metals 111-112 (2000), 35-38.

Curry, R.J. and W.P. Gillin "1.54 μm electroluminescence from erbium (III) tris(8-hydroxyquinoline) (erQ)-based organic light-emitting diodes" Applied Physics Letters (Sep. 6, 1999) vol. 75, No. 10, pp. 1380-1382.

Sloof, L.H. et al. "Near-Infrared electroluminescence of polymer light-emitting diodes doped with a lissamine-sensitized $Nd^{3+}$ complex" Applied Physics Letters (Apr. 9, 2001) vol. 78, No. 15, pp. 2122-2124.

Sun, R.G. et al. "1.54 μm infrared photoluminescence and electroluminescence from an erbium organic compound" Journal of Applied Physics (May 15, 2000) vol. 87, No. 10, 7589-7591.

* cited by examiner

PPP

PPP-RX

PPP-ORX

PF-R

PPV

MEH-PPV

P3AT

PTV

PPy

PPy-V

M = Yb, Tm, Er, Ho

R = Me, Ph, Napthyl

M = Yb, Tm, Er, Ho, Nd

X = Cl; M = Yb, Tm, Er, Ho
X = I; M = Nd

M = Yb, Tm, Er, Ho

M = Yb, Er

M = Tm, Er, Ho

METHOD AND APPARATUS FOR PRODUCING NEAR-INFRARED RADIATION

CROSS-REFERENCE TO RELATED APPLICATION(S)

This application claims the benefit of provisional patent application Ser. No. 60/297,580, filed Jun. 12, 2001, which is hereby incorporated by reference in its entirety, including all figures, tables, and drawings.

The subject invention was made with government support under a research project supported by the Defense Advanced Research Projects Agency Grant No. DAAD 19-00-1-0002. The government has certain rights in this invention.

BACKGROUND OF THE INVENTION

Since the initial discovery of polymer organic light emitting diodes (PLEDs), substantial developments have occurred that have led to a fundamental understanding of their operation as well as the development of practical devices. Multi-component polymer and organic LEDs that exploit energy transfer among various emitting chromophores distributed within the active matrix allow precise control of emission energies. These multi-component devices have been designed using a variety of approaches that include direct blending of two polymers, the use of intimately mixed polymer layers (such as polyelectrolyte multilayers, thin coated films, laminates, etc.) and the incorporation of emitting metal complexes within polymer host matrices. Examples of the latter include the use of blue emitting derivatized poly(p-phenylene)s doped with Eu complexes to produce red light emission, blending of poly(p-phenylene vinylene)s with a phosphorescent Pt(II)-porphyrin, and luminescent Ir(III) complexes dispersed in small-molecule host matrices. Due to their unique electronic structure, many lanthanide ions luminesce in the near-IR. Taking advantage of this phenomenon, films of neat lanthanide complexes, a blend of an Er(III) complex in poly(vinylcarbazole), and a blend of a Nd-lissamine complex dispersed in a poly(fluorene-benzothiadiazole) co-polymer host have been used as the emitting materials to afford electroluminescent devices that emit in the near-IR.

BRIEF SUMMARY OF THE INVENTION

The subject invention pertains to a method, apparatus, and composition of matter for producing near-infrared (near-IR) radiation. The subject invention can incorporate conjugated polymers and/or non-conjugated polymers, wherein the polymers can be luminescent or non-luminescent, and can incorporate metals and/or metal compounds which emit in the near infrared. In a specific embodiment, the subject invention relates to a composition of matter having a luminescent polymer and a metal containing compound where the metal containing compound incorporates a metal-ligand complex such that the absorption spectrum of the metal-ligand complex at least partially overlaps with the emission spectrum of the luminescent polymer. As the absorption spectrum of the metal-ligand complex at least partially overlaps with the emission spectrum of the luminescent polymer, when the luminescent polymer becomes electronically excited, energy can be transferred from the luminescent polymer to the metal-ligand complex. At least a portion of the energy transferred from the luminescent polymer to the metal-ligand complex can then be emitted by the metal-ligand complex as near-infrared radiation. The luminescent polymer can be a conjugated polymer or a non-conjugated polymer. In a specific embodiment, conjugated polymers which are luminescent can be utilized.

In a specific embodiment having a luminescent polymer and a metal-containing compound where the metal-containing compound incorporates a metal-ligand complex, the absorption spectrum of the ligand, of the metal-ligand complex, at least partially overlaps with the emission spectrum of the luminescent polymer such that when the luminescent polymer becomes electronically excited, energy is transferred from the luminescent polymer to the ligand. Energy can then be transferred from the ligand to the metal by sensitization. The energy transferred to the metal by sensitization is then emitted as near-IR radiation.

In a specific embodiment, the metal-containing compound can be a metal organic compound. In a further specific embodiment, the metal organic compound can have a lanthanide as the metal. The metal organic compound having a lanthanide can also have one or more ligands. In a specific embodiment, the metal organic compound can have a ligand which is a macrocyclic chelator and is strongly light absorbing. Specific examples of metal compounds which can be utilized with the subject invention include, but are not limited to, those that contain lanthanides such as Yb, Nd, Ho, Pr, Er, or Tm. Examples of (other) metal complexes which can be utilized with the subject invention include but are not limited to oxomolybdenum(IV) complexes, for example [MoOCl(CN-t-Bu)$_4$]$^+$ and related compounds, or Pt—Pd stacked complexes such as [Pt(NC—R)$_4$$^{2+}$,Pd(CN)$_4$$^{2+}$] and related compounds.

The energy transferred from the luminescent polymer to the metal-ligand complex or from the luminescent polymer to the ligand can be transferred by one or more mechanisms including, but not limited to Förster transfer and/or Dexter transfer.

In another specific embodiment, a composition of matter can have a luminescent polymer and a metal such that the absorption spectrum of the metal at least partially overlaps with the emission spectrum of the luminescent polymer. As the absorption spectrum of the metal at least partially overlaps with the emission spectrum of the luminescent polymer, when the luminescent polymer becomes electronically excited energy can be transferred from the luminescent polymer to the metal. At least a portion of the energy transferred from the luminescent polymer to the metal can then be emitted by the metal as near-infrared radiation.

The luminescent polymer can become electronically excited upon the creation of excitons in the luminescent polymer by, for example, the application of an electric current through the luminescent polymer and/or exposing the luminescent polymer to photons. Once created, the excitons within the luminescent polymer can be mobile within the luminescent polymer. A least a portion of these mobile excitons can then be trapped by the metal, or metal-ligand complex, within the luminescent polymer.

In another specific embodiment, a composition of matter in accordance with the subject invention can incorporate a non-luminescent host polymer, which can be conjugated or non-conjugated, and a metal compound such that excited states can be formed on ligands of the metal complex. Once created, the excited states can be mobile on the ligands. Energy can then be transferred from the ligands to the metal. At least a portion of the energy transferred to the metal can then be emitted by the metal as near-infrared radiation. The excited states formed on ligands of the metal complex by, for example, the application of an electric current through the host polymer with the metal compound and/or exposing the host polymer with the metal compound to photons. In a specific embodiment the host polymer with the metal compound is exposed to photons having a wavelength which overlaps with the absorption spectrum of the ligands of the metal complex.

The subject invention also relates to light emitting diodes (LED's), lasers, and other light emitting and/or light guiding devices incorporating the composition of matter of the subject invention. For example, the subject composition of matter can be utilized to fabricate an optically pumped solid state laser. The material useful in the practice of this invention would be a physical or chemical blend of a fluorescent conjugated polymer and a metal compound that has an absorption that overlaps at least partially with the polymer's fluorescence. In a specific embodiment, this material, in the form of a nondiluted thin film, meets the criteria of; i. having a strong absorption in the ground state with an absorption coefficient of at least about $10^4$ cm$^{-1}$ and an absorption depth not greater than about 1 μm, ii. having an efficient near-IR luminescence emission from the excited state metal compound; this emission being shifted to lower energy relative to the ground state absorption of the conjugated polymer and the metal compound, and iii. providing stimulated emission which is not overwhelmed by photoinduced absorption, such that the thin film exhibits gain narrowing and amplified spontaneous emission.

In a specific embodiment, referring to FIG. 10, an optical fiber having a core 1 and a cladding 2 can incorporate the composition of matter of the subject invention. For example, the core 1 and/or the cladding 2 of the fiber can incorporate the subject composition of matter. In a specific embodiment, a layer 3 of the subject composition of matter can be placed between the core 1 of the fiber and the cladding 2 of the fiber such that the evanescent portion of the light guided in the core 1 can extend into this layer 3. In an alternative embodiment, the subject composition of matter can be used as a cladding 2. Again, the evanescent portion of light guided by the fiber can extend into the cladding. By causing the luminescent polymer of the subject composition to be in an excited state by, for example, exposing the luminescent polymer to photons, excitons can be created and trapped by the metal or metal-ligand complexes. As the evanescent portion of light passes through the subject composition with trapped excitons, stimulated emission can be triggered resulting in amplification of evanescent portions of the light. The amplification of the evanescent portion of the light can then result in amplification of the light within the fiber.

BRIEF DESCRIPTION OF THE DRAWINGS

FIGS. 3A and 3B show the PL of films of neat MEH-PPV (--) and MEH-PPV doped with 2 mol % Yb(TPP)acac (—) excited at 350 nm.

DETAILED DISCLOSURE OF THE INVENTION

Figure 1A:
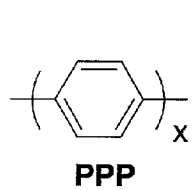
FIGS. 1A-1J show the chemical structures of various conjugated polymers that can be utilized with the subject invention.

The subject invention pertains to a method, apparatus, and composition of matter for producing near-infrared (near-IR) radiation. The subject invention can incorporate conjugated polymers and/or non-conjugated polymers, wherein the polymers can be luminescent or non-luminescent, and can incorporate metals and/or metal compounds which emit in the near infrared. Near-IR photoluminescence (PL) and/or electroluminescence (EL) can be achieved from blends of conjugated polymers, examples of which are shown in FIGS. 2A-2F. In a specific embodiment, near-IR photoluminescence (PL) and/or electroluminescence (EL) can be achieved from blends of MEH-PPV with Yb(TPP)acac and/or Er(TPP)acac, wherein TPP=5,10,15,20-tetraphenylporphyrin and acac=acetylacetonate. In a specific embodiment, the subject invention can involve sensitization of a lanthanide-TPP complex by a conjugated polymer, which can lead to the narrow bandwidth emission derived from, for example, the Yb $^2F_{5/2} \rightarrow ^2F_{7/2}$ (977 nm) and/or Er $^4I_{13/2} \rightarrow ^4I_{15/2}$ (1560 nm) transitions.

In a specific embodiment, the subject invention can incorporate non-conjugated and non-luminescent host polymers blended with near infrared emitting lanthanide complexes in which the complex ligands can either absorb photons (photoluminsecent) or can carry the excited states (electroluminescent). Examples of host polymers include, but are not limited to, thermoplastics and thermostats which would not react with the metal complex and quench its luminescence. Specific examples of such polymers include, but are not limited to, polystyrene, other styrenic polymers including ABS, poly(methyl methacrylate), poly(butyl acrylate), other acrylic polymer and copolymers, polybutadiene, polyisoprene, other diene polymers and copolymers, poly(vinyl chloride), other vinyl polymers, poly(ethylene oxide) and copolymers, epoxies, polyurethanes, and silicone containing polymers.

The composition and device of the subject invention can include various concentrations of metal-ligand complex and polymer. The optimum molar ratio of metal-ligand complex to monomer unit can be determined by one of ordinary skill in the art, depending upon the particular metal-ligand complex and monomer(s) utilized. Preferably, the composition and device of the subject invention comprise about 5 mole % to about 20 mole % metal-ligand complex and about 80 mole % to about 95 mole % monomer unit.

The components of the near-IR emitting device can be selected to optimize energy transfer from the MEH-PPV host to the lanthanide-(TPP)acac complexes, and to allow for the most efficient near-IR emission. MEH-PPV is a well-known and well-characterized material that displays efficient PL and EL. A variety of lanthanides are available and can be selected to provide tunable PL and EL throughout the near-IR region. In specific embodiments, Yb- and Er-TPP(acac) complexes can provide emission at 977 nm and 1560 nm, respectively. These wavelengths can be useful, for example, in optoelectronic communication and biomedical applications.

In a specific embodiment, in order to enhance the efficiency of the luminescence from lanthanides, the ions can be complexed with a ligand-chromophore which can serve to more efficiently harvest the energy and sensitize the lanthanide's emission via, for example, exchange energy transfer from the ligand-based triplet state. The TPP ligand has a high degree of spectral overlap of its Q-absorption bands with the MEH-PPV fluorescence allowing, for example, for highly efficient Förster energy transfer. Due to this excellent spectral overlap, addition of Yb(TPP)acac or Er(TPP)acac to MEH-PPV can lead to efficient quenching of the fluorescence from the conjugated polymer host. Furthermore, in lanthanide porphyrin complexes intersystem crossing to the triplet state can occur with high efficiency. In some embodiments, this efficiency can approach 100%. In a specific embodiment, the ligand can act as an effective sensitizer to produce the spin-forbidden, luminescent F-states of the lanthanide ions.

Figure 3A:
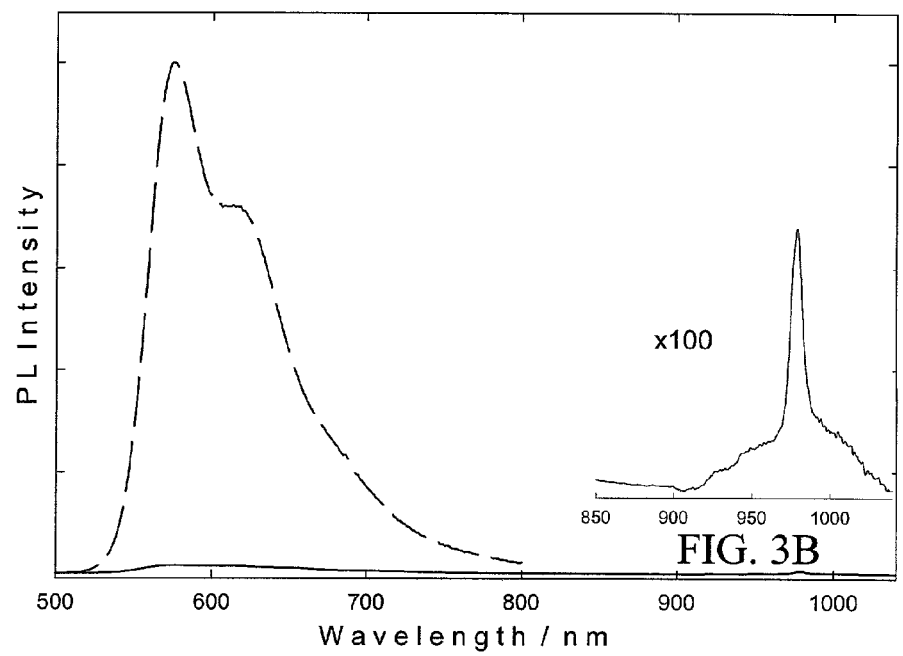

Formulation of the subject EL device material can be guided by, for example, PL studies of 100 nm thick spin-coated films produced by blending Yb(TPP)acac or Er(TPP) acac with MEH-PPV. FIG. 3 illustrates the PL of films of neat MEH-PPV (--) and MEH-PPV doped with 2 mol % Yb(TPP) acac (—) (based on polymer repeat unit), upon excitation at 350 nm. The spectrum of the blend is plotted on the same absolute scale as that of the neat polymer, with the y-scale of the inset expanded by a factor of 100. The MEH-PPV fluorescence that appears at 589 nm is quenched approximately 98% when Yb(TPP)acac is present. Quenching of the visible emission is accompanied by the appearance of the Yb emission at 977 nm in the near-IR. An excitation spectrum for the 977 mn emission shows a strong band that is due to the visible absorption of the host polymer, demonstrating its role as a sensitizer. Analogous results can be observed when Er(TPP) acac is blended into MEH-PPV, with the near-IR emission appearing at 1560 nm.

The PL observations appear to be consistent with the following sequence of events: light absorption produces the MEH-PPV singlet exciton, the singlet exciton is then trapped by the porphyrin ligand exciting it to the $^1\pi,\pi^*$ state, intersystem crossing occurs affording the $^3\pi,\pi$ state of the TPP ligand, the $^3\pi,\pi$ state of the TPP ligand subsequently sensitizes the Yb $^2F_{5/2}$ state, and the Yb$^2F_{5/2}$ state emits at 977 nm.

In a specific embodiment, a near-IR electroluminescent device can be constructed beginning with indium-tin-oxide (ITO) glass coated with PEDOT/PSS (Bayer Baytron P VP Al 4083) as a hole transport layer. The MEHPPV:Ln(TPP)acac blend can be spin-coated from solution (1 wt % of the polymer in toluene) and the resulting film vacuum dried for 12 h ($1\times10^{-6}$ torr) at room temperature. Calcium (50 Å) followed by Al (1500 Å) layers can then be thermally evaporated at $1\times10^{-6}$ torr without breaking the vacuum between metal depositions. After deposition, the device can be encapsulated with epoxy to minimize exposure to oxygen and moisture. The device measurements can be made at room temperature.

Figure 4:
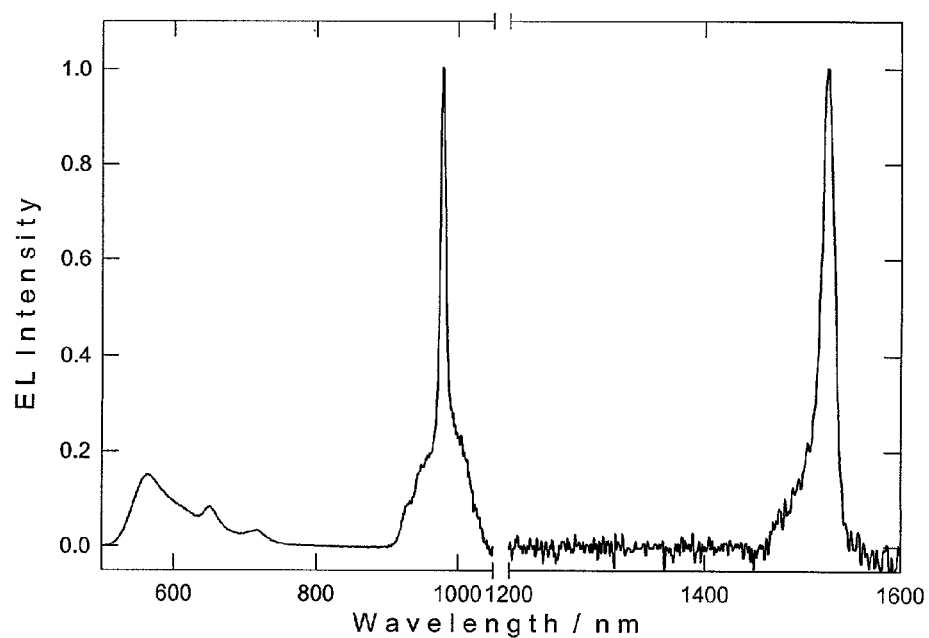
FIG. 4 shows the EL spectrum of MEH-PPV doped with 5 mol % Yb(TPP)acac measured at 9V (left) and of MEH-PPV doped with 5 mol % Er(TPP)acac at 13V (right).

FIG. 4 shows the EL spectra of polymer LEDs (PLEDs) fabricated using Ln(TPP)acac complexes where Ln=Yb$^{3+}$ (5 mol %) and Er$^{3+}$ (5 mol %). The visible emission for the Er$^{3+}$ is not shown but is similar in intensity to the Yb(TPP)acac doped device of FIG. 3. The spectral data indicates that the visible emission of the MEH-PPV at 589 nm is strongly suppressed, and the device emission is dominated by the near-IR output of the Ln complexes. The data also shows that the narrow bandwidth characteristic of the lanthanide emission is preserved in the EL devices. The two bands on the red-side of the MEH-PPV emission are believed to arise from the porphyrin triplet state.

Figure 9:
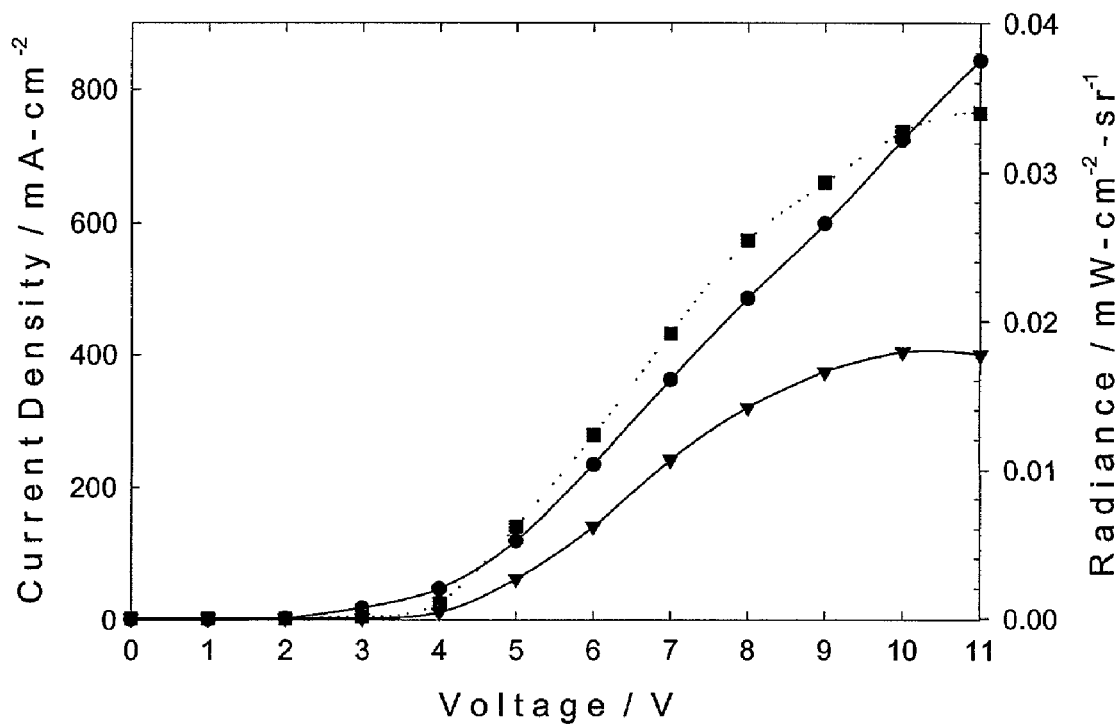
FIG. 9 shows current (●) and power output of visible (■) and near-infrared (▼) region of 5 mol % Yb(TPP)acac in MEH-PPV as a function of voltage at room temperature.
Figure 10:
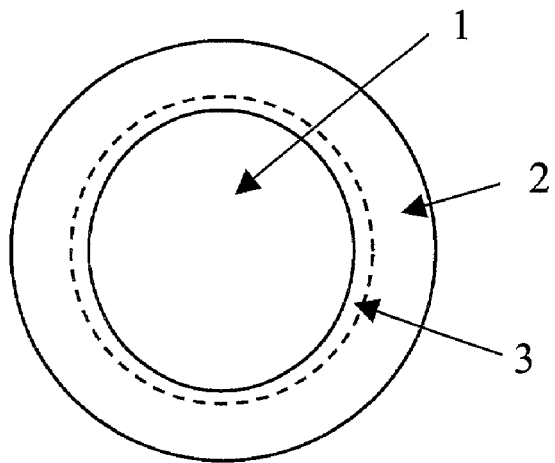
FIG. 10 shows a cross-section of an optical fiber incorporating a composition of matter in accordance with the subject invention.

FIG. 9 shows the room temperature i-V and quantitative light output characteristics for a device that contains 5 mol % of Yb(TPP)acac blended with MEH-PPV as the active material. It can be seen that the emission turns on at ca. 4 V and the device exhibits typical Schottky diode characteristics. The turn-on voltage is low compared to typical devices constructed with neat lanthanide complexes. At high current densities, a decrease in the emission efficiencies is observed. The external near-IR EL efficiency of the device is $1.5\times10^{-4}$ at 7 V. The comparatively low device efficiency may be due to highly efficient non-radiatative decay channels that operate in the lanthanide excited state. The fact that non-radiative decay is an important decay channel to the Yb $^2F_{5/2}$ state in the blends appears to be confirmed by temperature dependent PL experiments which show that the intensity of the 977 nm emission increases with decreasing temperature.

In a specific device architecture in accordance with the subject invention, the porphyrin ligand may play an expanded role beyond the simple "antenna/spin-state transducer" effect. Possible functions of the porphyrin include enhanced hole and/or electron transport which could thus increase device efficiency and decrease the turn-on voltage.

Figure 5:
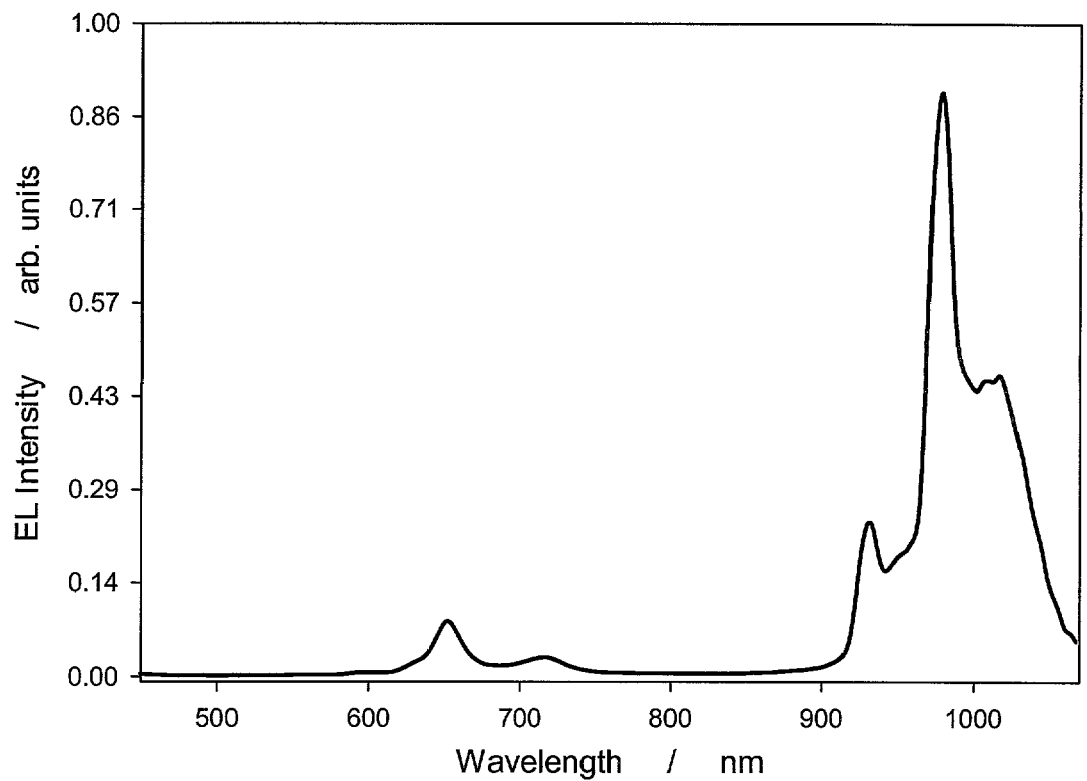
FIG. 5 shows the electroluminescence spectrum of Yb(TPP)TP in polystyrene.
Figure 6:
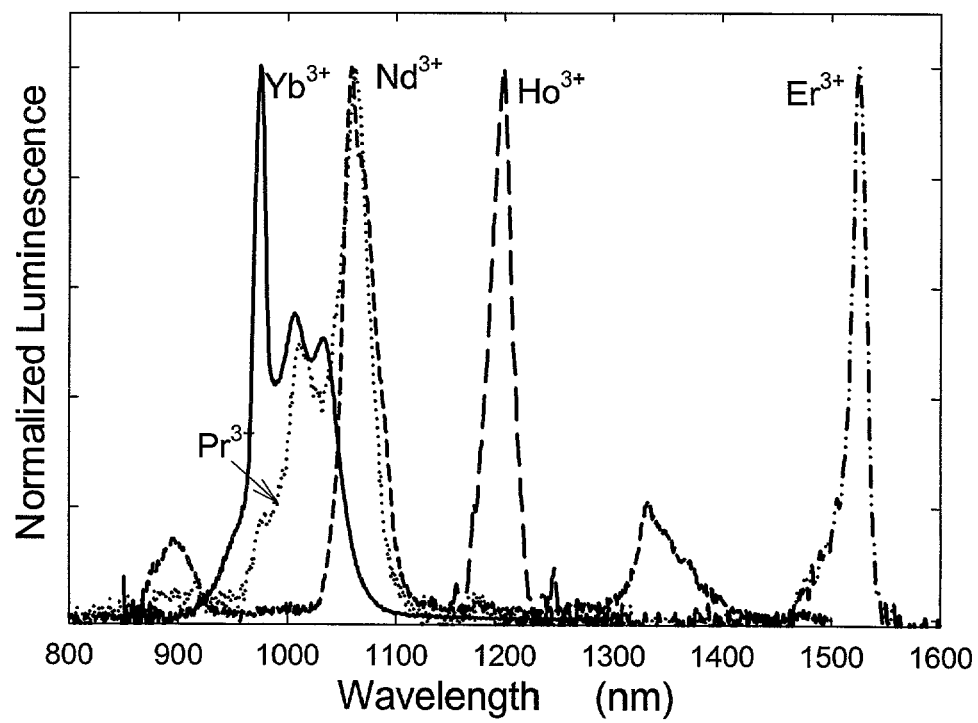
FIG. 6 shows the near-IR luminescence of lanthanide complexes.
Figure 7:
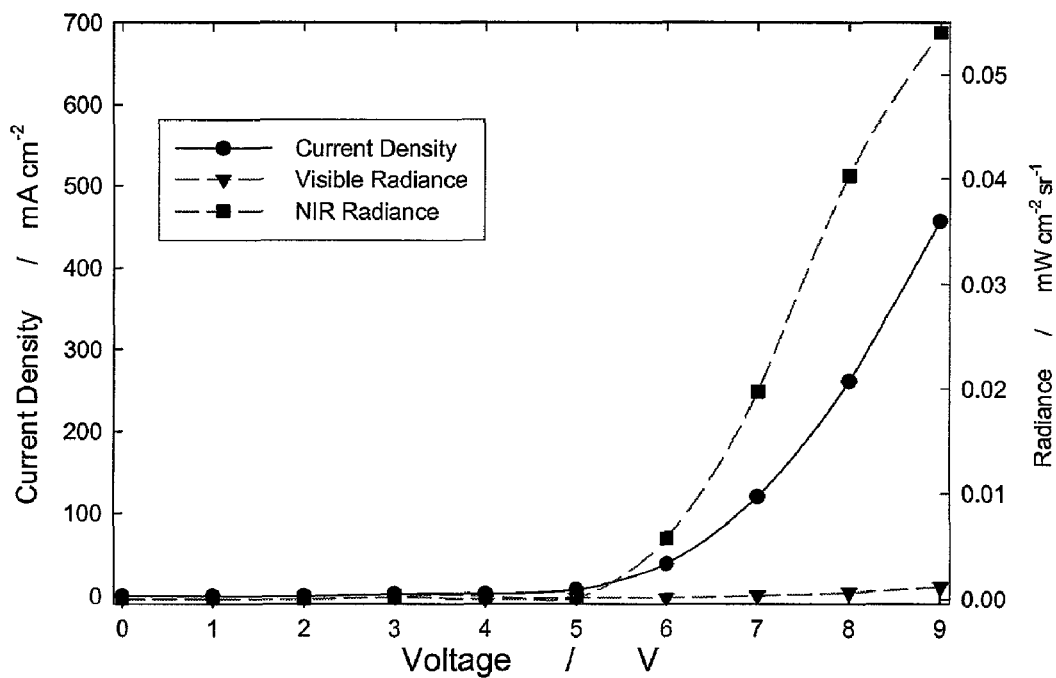
FIG. 7 shows current (●) and power output of visible (■) and near-infrared (▼) region of 5 mol % Yb(TPP)TP in PPP-OR11 as a function of voltage at room temperature.
Figure 8:
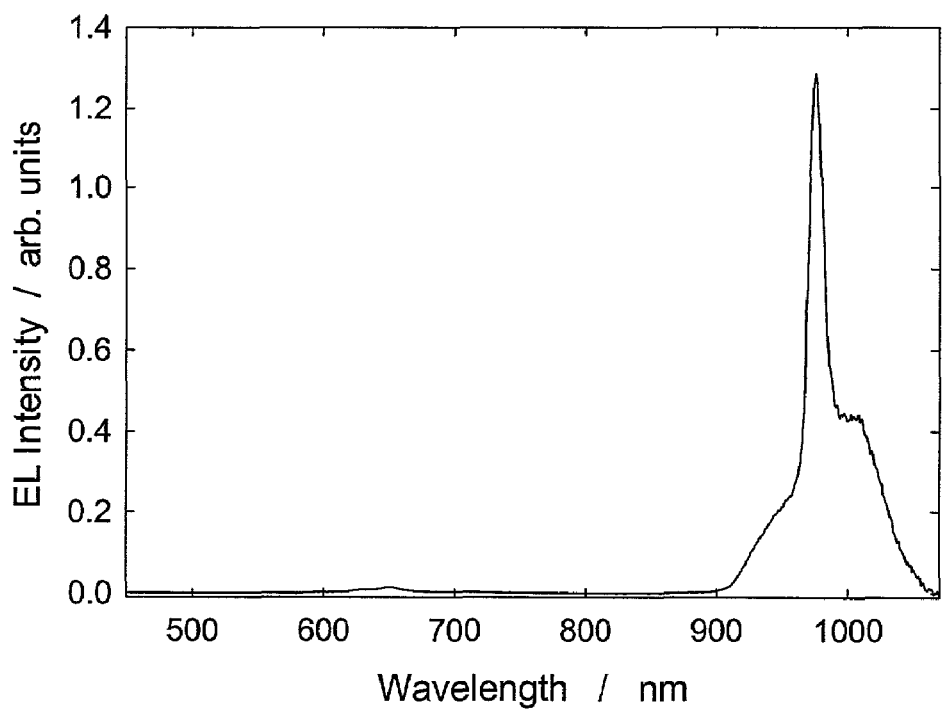
FIG. 8 shows the electroluminescence spectrum of an electroluminescence device that contains 5 mol % Yb(TPP)TP in PPP-OR11.

In another specific embodiment, a near-IR electroluminescent device is constructed beginning with indium-tin-oxide (ITO) glass coated with PEDOT/PSS (Bayer Baytron P VP Al 4083) as a hole transport layer. A solution of polystyrene ($M_n=230,000$) and the lanthanide complex (2 mg of polymer per mL of CHCl$_3$) is spin cast onto the PEDOT/PSS coated ITO at 800 rpm. The resulting film is dried for 12 hours ($1\times10^{-6}$ torr) at room temperature. Layers of calcium (50 Å) followed by aluminum (1500 Å) are thermally deposited at $1\times10^{-6}$ torr without breaking the vacuum between metal depositions. After deposition, the device is encapsulated with epoxy to minimize exposure to oxygen and moisture. The device measurements are made at room temperature. FIG. 5 shows the electroluminescence spectrum of a device prepared using Yb(TPP)TP as the active material dispersed in polystyrene.

In a specific embodiment, the metal-containing compound can be a metal organic compound. In a further specific embodiment, the metal organic compound can have a lanthanide as the metal. The metal organic compound having a lanthanide can also have one or more ligands. In a specific embodiment, the metal organic compound can have a ligand which is a macrocyclic chelator and is strongly light absorbing. Specific examples of metal compounds which can be utilized with the subject invention include, but are not limited to, those that contain lanthanides such as Yb, Nd, Ho, Pr, Er, or Tm. Examples of (other) metal complexes which can be utilized with the subject invention include but are not limited to oxomolybdenum(IV) complexes, for example [MoOCl (CN-t-Bu)$_4$]$^+$ and related compounds, or Pt—Pd stacked complexes such as [Pt(NC—R)$_4$$^{2+}$,Pd(CN)$_4$$^{2-}$] and related compounds. As used herein, the term "metal" is intended to denote a metal atom, metal ion, or metal-containing moiety.

Ligands which can be utilized in accordance with the subject invention include, but are not necessarily limited to, the entire family of light absorbing organic compounds that are known to bind to metal ions by chelation, coordinate covalent bonding, or other binding mechanisms. Specific examples include (1) tetraaryl porphyrins, where the aryl group may, or may not, be substituted with alkyl, alkyl ether, oligoether, alkyl sulfonate, alkyl amine, and/or other substituent groups or atoms, such as 5,10,15,20-tetraphenylporphyrin, (2)

octaalkyl porphyrins including octaethyl porphyrin, (3) chlorophyls, bacteriochlorophyls, chlorins, and other naturally and unnaturally occurring tetrapyrrole macrocycles, (4) texaphyrins and related substituted and unsubstituted pentapyrrole macrocycles, (5) phthalocyanines, naphthophthalocyanines, and other structurally-related substituted and unsubstituted phthalocyanines.

FIGS. 2A-2F show the chemical structures of various metal-ligand complexes that can be utilized with the subject invention.

The entire family of conjugated polymers can be utilized with the subject invention, including (1) those that are fully conjugated, (2) those that include broken links of conjugation, and (3) those that incorporate copolymers of either block or random nature. The polymers and copolymers can have structures that include backbone, side chains, graft, branch, hyperbranched, and/or dendritic. Examples of conjugated polymers which may be used include, but are not limited to the following:

1. poly(arylenes) including polyphenylenes, polyfluorenes, and polyanthracenes; other hydrocarbon aromatic polymers which have high efficiency of light emission can also be used;
2. poly(arylene vinylene)s including aromatic hydrocarbon arylenes such as poly(phenylene vinylene), poly(anthracenylene vinylene) and other aryl linked vinylene-based polymers; other hydrocarbon vinylene-based polymers which have high efficiency of light emission can also be used; poly(arylene vinylene)s where the arylene unit is heterocyclic in nature, including poly(thienylene vinylene) and/or poly(pyridyl vinylene), known for their red-shifted luminescence relative to PPV's and oxadiazole-containing, quinoline-containing, or silole-containing polymers, known for their enhanced electron transport carrying capabilities; and
3. poly(heterocycle)s, including poly(thiophene)s, known for their enhanced hole transporting capabilities and poly(furans).

Figure 1B:
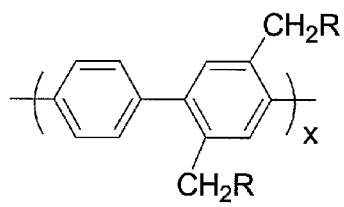
Figure 1C:
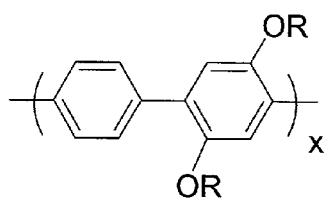
Figure 1D:
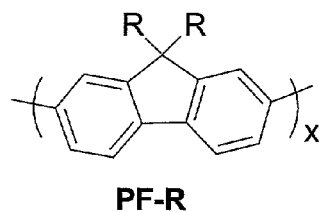
Figure 1E:
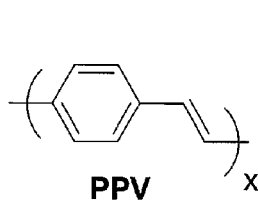
Figure 1F:
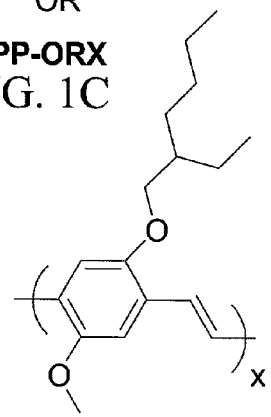
Figure 1G:
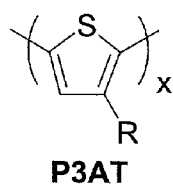
Figure 1H:
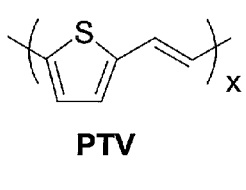
Figure 1I:
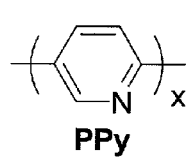
Figure 1J:
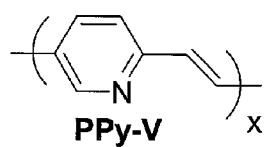
Figure 2A:
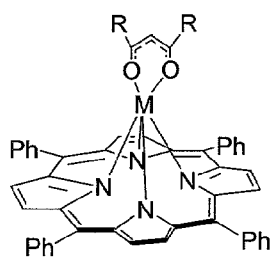
FIGS. 2A-2F show the chemical structures of various metal-ligand complexes that can be utilized with the subject invention.
Figure 2C:
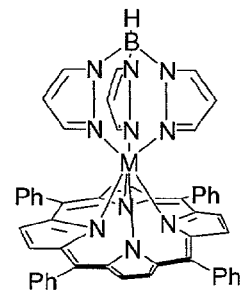
Figure 2B:
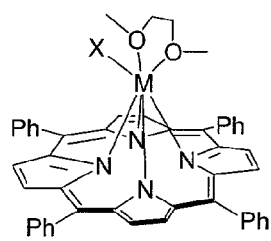
Figure 2D:
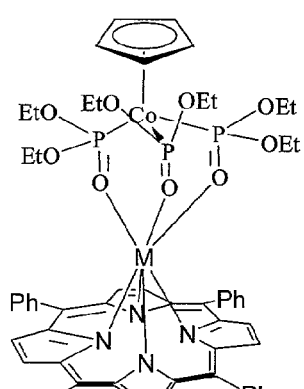
Figure 2E:
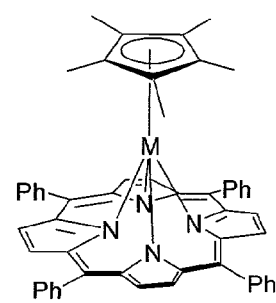
Figure 2F:
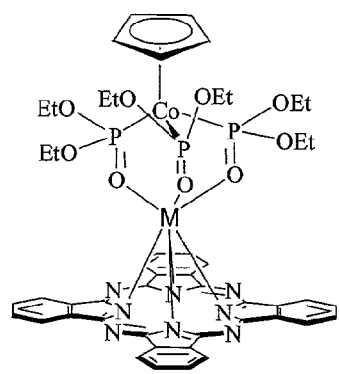

FIGS. 1A-1J show the chemical structures of some conjugated polymers that can be utilized with the subject invention. FIG. 1A shows "PPP" or poly(pphenylene). FIGS. 1B and 1C show PPP with RX and ORX pendant groups. Preferably, R is selected from the group consisting of $H_1$ alkyl, alkyl ether, oligoether, alkyl sulfonate, and alkyl amine. FIG. 1D shows "PF-R" or poly(9,9-dialkylfluorene). FIG. 1E shows "PPV" or poly(p-phenylene vinylene). FIG. 1F shows "MEH-PPV" or [2-methoxy, 5-(2'-ethyl-hexyloxy)-p-phenylene-vinylene]. FIG. 1G shows "P3AT" or poly(3-alkyl-thiophene). FIG. 1H shows "PTV" or polythienlene vinylene. FIG. 1I shows "PPy" or poly(p-pyridine). FIG. IJ shows "PPy-V" or poly(p-pyridyl vinylene).

Other examples of polymers that can be used with the subject invention include poly(acetylene) or "PA", poly(p-phenylene-ethynylene)s or "PPE", and other poly(arylene-ethynylene)s. All of the polymer families can be functionalized to provide processability through solubility and fusibility. Substituent groups include but are not limited to alkyl, alkyl ether, oligoether, alkyl sulfonate, alkyl amine and other groups.

All patents, patent applications, provisional applications, and publications referred to or cited herein are incorporated by reference in their entirety to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application and the scope of the appended claims.

We claim:

1. A composition of matter, comprising:
    a polymer, wherein the polymer is a luminescent polymer, wherein the polymer has the characteristic of becoming electronically excited upon exposure of the polymer to photons, and
    a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation,
    wherein the absorption spectrum of the metal-ligand complex at least partially overlaps with the emission spectrum of the polymer such that when the polymer becomes electronically excited, energy is transferred from the polymer to the metal-ligand complex, wherein at least a portion of the energy transferred from the polymer to the metal-ligand complex is emitted by the metal-ligand complex as near-infrared radiation.

2. The composition of matter according to claim 1, wherein the metal containing compound is a metal organic compound.

3. The composition of matter according to claim 1, wherein the absorption spectrum of the ligand at least partially overlaps with the emission spectrum of the polymer such that when the polymer becomes electronically excited, energy is transferred from the polymer to the ligand and then energy is transferred from the ligand to the metal by sensitization, wherein the energy transferred to the metal by sensitization is emitted as near-infrared radiation.

4. The composition of matter according to claim 1, wherein said polymer is a copolymer.

5. The composition of matter according to claim 1, wherein said polymer is a conjugated polymer.

6. The composition of matter according to claim 5, wherein said polymer is a conjugated polymer selected from the group consisting of poly(p-phenylene); poly(9,9-dialkylfluorene); poly(p-phenylene vinylene); [2-methyoxy, 5-(2'-ethyl-mexyloxy)-p-phenylene-vinylene]; poly(3-alkyl-thiophene); polythienylene vinylene; poly(p-pyridine); and poly(p-pyridyl vinylene).

7. The composition of matter according to claim 1, wherein said polymer is a non-conjugated polymer.

8. The composition of matter according to claim 7, wherein said polymer is a non-conjugated polymer selected from the group consisting of polystyrene, acrylonitrile butadiene styrene, poly(methyl methacrylate), poly(butyl acrylate), polybutadiene, polyisoprene, poly(vinyl chloride), and poly(ethylene oxide).

9. The composition of matter according to claim 1, wherein said polymer is a poly(arylene).

10. The composition of matter according to claim 1, wherein said polymer is a poly(arylene vinylene).

11. The composition of matter according to claim 1, wherein said polymer is selected from the group consisting of polyphenylene, polyfluorene, polyanthracene, poly(phenylene vinylene), poly(anthracenylene vinylene), and poly(furan).

12. The composition of matter according to claim 1, wherein said polymer is a poly(arylene vinylene), wherein the arylene unit is heterocyclic.

13. The composition of matter according to claim 1, wherein said polymer is a oxadiazole-containing polymer.

14. The composition of matter according to claim 1, wherein said polymer is a quinoline-containing polymer.

15. The composition of matter according to claim 1, wherein said polymer is [2-methyoxy, 5-(2'-ethyl-mexyloxy)-p-phenylene-vinylene].

16. The composition of matter according to claim 1, wherein said polymer is a thermoplastic.

17. The composition of matter according to claim 1, wherein said polymer is a thermoset.

18. The composition of matter according to claim 1, wherein said polymer is an epoxy.

19. The composition of matter according to claim 1, wherein said polymer is a styrenic polymer.

20. The composition of matter according to claim 1, wherein said polymer is an acrylic polymer.

21. The composition of matter according to claim 1, wherein said polymer is a polyurethane.

22. The composition of matter according to claim 1, wherein said polymer is polystyrene.

23. The composition of matter according to claim 1, wherein said polymer is poly(methyl methacrylate).

24. The composition of matter according to claim 1, wherein the metal of said metal-ligand complex is a lanthanide.

25. The composition of matter according to claim 1, wherein the metal of said metal-ligand complex is a lanthanide selected from the group consisting of ytterbium, neodymium, holmium, praseodymium, erbium, and thulium.

26. The composition of matter according to claim 1, wherein the ligand of said metal-ligand complex is a light absorbing organic compound.

27. The composition of matter according to claim 1, wherein the ligand of said metal-ligand complex is a macrocyclic chelator.

28. The composition of matter according to claim 1, wherein the ligand of said metal-ligand complex is selected from the group consisting of tetraaryl porphyrin, octaalkyl porphyrin, tetrapyrroler macrocycle, and textphyrin.

29. The composition of matter according to claim 1, wherein the ligand of said metal-ligand complex is selected from the group consisting of 5,10,15,20-tetraphenylporphyrin, octaethyl porphyrin, chlorophyll, bacteriochlorophyl, chlorin, bacteriochlorphyl, chlorin, and pentapyrrole macrocycle.

30. The composition of matter according to claim 1, wherein said metal-ligand complex is an oxomolybdenum (IV) complex.

31. The composition of matter according to claim 1, wherein said metal-ligand complex is a platinum-palladium stacked complex.

32. The composition of matter according to claim 1, wherein said metal-ligand complex is[Pt(NC—R)$_4^{2+}$,Pd(CN)$_4^{2-}$].

33. The composition of matter according to claim 1, wherein said metal-ligand complex is a structure selected from the group consisting of:

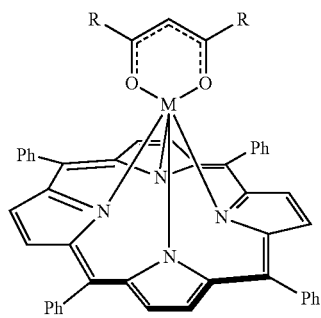

wherein M is chosen from Yb, Tm, Er, and Ho, R is chosen from Me, Ph, and Napthyl;

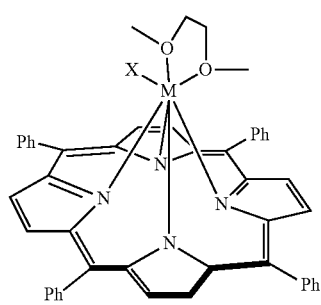

wherein M is chosen from Yb, Tm, Er, and Ho, and X is Cl, or M is Nd and X is I;

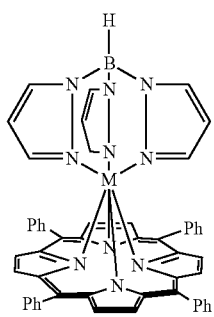

wherein M is chosen from Yb, Tm, Er, Nd, and Ho;

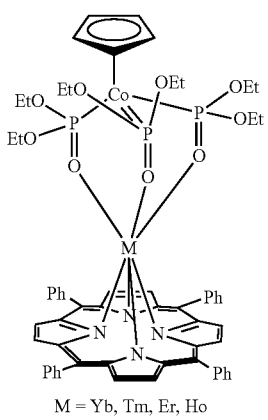

M = Yb, Tm, Er, Ho wherein M is chosen from Yb, Tm, Er, and Ho;

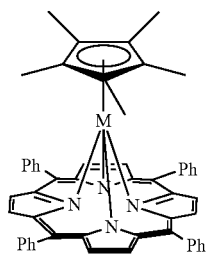

wherein M is chosen from Yb and Er; and

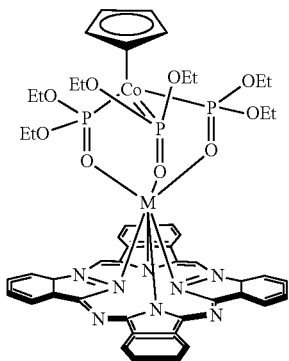

wherein M is chosen from Tm, Ho, and Er.

34. The composition of matter according to claim 1, wherein said polymer is [2-methyoxy, 5-(2'-ethyl-mexyloxy)-p-phenylene-vinylene] and wherein said metal-ligand complex is Yb(TPP)acac.

35. The composition of matter according to claim 1, wherein said polymer is [2-methyoxy, 5-(2'-ethyl-mexyloxy)-p-phenylene-vinylene] and wherein said metal-ligand complex is Er(TPP)acac.

36. The composition of matter according to claim 1, wherein said polymer is polystyrene and said metal-ligand complex is Yb(TPP)TP.

37. The composition of matter according to claim 1, wherein said polymer is polystyrene and said metal-ligand complex is Er(TPP)TP.

38. The composition of matter according to claim 1, wherein said metal-ligand complex comprises a plurality of ligands.

39. The composition of matter according to claim 1, wherein said polymer is selected from the group consisting of poly(acetylene), poly(p-phenylene-ethynylene)s, and other poly(arlene-ethynylene)s.

40. The composition of matter according to claim 1, wherein the polymer comprises silicone.

41. The composition of matter according to claim 1, wherein said polymer is

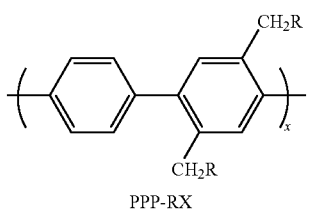

PPP-RX and wherein R is selected from the group consisting of alkyl, alkyl ether, oligoether, alkyl sulfonate, and alkyl amine, and wherein X is equal to or greater than one.

42. The composition of matter according to claim 1, wherein said polymer is

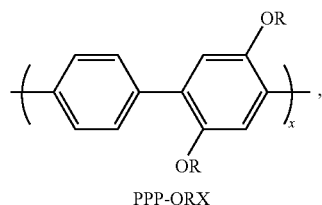

PPP-ORX wherein R is selected from the group consisting of alkyl, alkyl ether, oligoether, alkyl sulfonate, and alkyl amine, and wherein X is equal to or greater than one.

43. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation, wherein said metal-ligand complex is $[Pt(NC—R)_4^{2+}, Pd(CN)_4^{2-}]$.

44. The composition of matter according to claim 43, wherein the polymer includes at least one polymer chosen from: a copolymer, a conjugated polymer, and a non-conjugated polymer.

45. The composition of matter according to claim 43, wherein the polymer includes at least one polymer chosen from: a poly(arylene), a poly(arylene vinylene), and a poly(arylene vinylene) having the arylene unit be heterocyclic.

46. The composition of matter according to claim 43, wherein the polymer includes at least one polymer chosen from: a oxadiazole-containing polymer and a quinoline-containing polymer.

47. The composition of matter according to claim 43, wherein the polymer includes at least one polymer chosen from: a thermoplastic, a thermoset, an epoxy, a styrenic polymer, an acrylic polymer, a polyurethane, and a silicone.

48. The composition of matter according to claim 43, wherein said polymer is

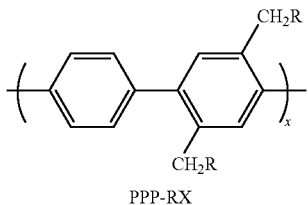

PPP-RX and wherein R is selected from the group consisting of alkyl, alkyl ether, oligoether, alkyl sulfonate, and alkyl amine, and wherein X is equal to or greater than one.

49. The composition of matter according to claim 43, wherein said polymer is

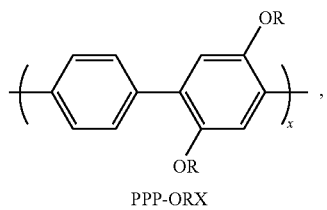

PPP-ORX wherein R is selected from the group consisting of alkyl, alkyl ether, oligoether, alkyl sulfonate, and alkyl amine, and wherein X is equal to or greater than one.

50. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation,
wherein said metal-ligand complex is a structure selected from the group consisting of:

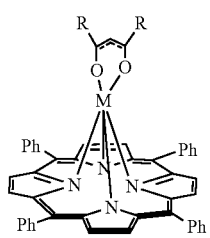

wherein M is chosen from Yb, Tm, Er, and Ho, R is chosen from Me, Ph, and Napthyl;

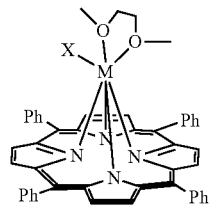

wherein M is chosen from Yb, Tm, Er, and Ho, and X is Cl, or M is Nd and X is I;

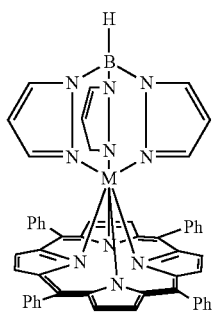

wherein M is chosen from Yb, Tm, Er, Nd, and Ho;

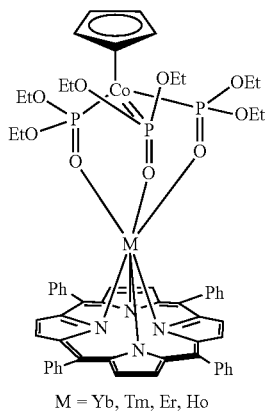

M = Yb, Tm, Er, Ho wherein M is chosen from Yb, Tm, Er, and Ho;

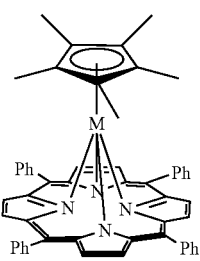

wherein M is chosen from Yb and Er; and

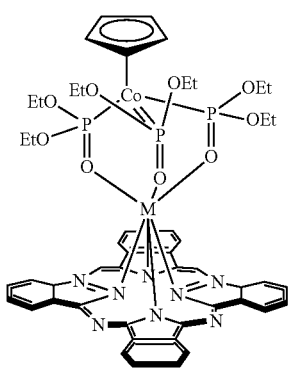

wherein M is chosen from Tm, Ho, and Er.

51. The composition of matter according to claim 50, wherein the polymer includes at least one polymer chosen from: a copolymer, a conjugated polymer, and a non-conjugated polymer.

52. The composition of matter according to claim 50, wherein the polymer includes at least one polymer chosen from: a poly(arylene), a poly(arylene vinylene), and a poly(arylene vinylene) having the arylene unit be heterocyclic.

53. The composition of matter according to claim 50, wherein the polymer includes at least one polymer chosen from: a oxadiazole-containing polymer and a quinoline-containing polymer.

54. The composition of matter according to claim 50, wherein the polymer includes at least one polymer chosen from: a thermoplastic, a thermoset, an epoxy, a styrenic polymer, an acrylic polymer, a polyurethane, and a silicone.

55. The composition of matter according to claim 50, wherein said polymer is

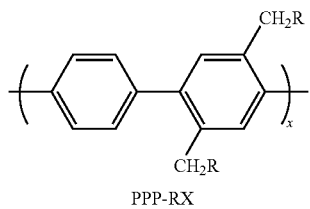

PPP-RX and wherein R is selected from the group consisting of alkyl, alkyl ether, oligoether, alkyl sulfonate, and alkyl amine, and wherein X is equal to or greater than one.

56. The composition of matter according to claim 50, wherein said polymer is

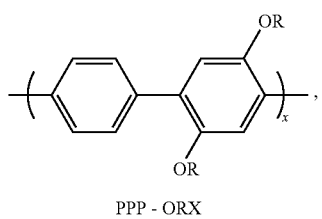

PPP - ORX wherein R is selected from the group consisting of alkyl, alkyl ether, oligoether, alkyl sulfonate, and alkyl amine, and wherein X is equal to or greater than one.

57. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation, wherein said polymer is [2-methyoxy, 5-(2'-ethyl-mexyloxy)-p-phenylene-vinylene] and wherein said metal-ligand complex is Yb(TPP)acac.

58. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation, wherein said polymer is [2-methyoxy, 5-(2'-ethyl-mexyloxy)-p-phenylene-vinylene] and wherein said metal-ligand complex is Er(TPP)acac.

59. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation, wherein said polymer is polystyrene and said metal-ligand complex is Yb(TPP)TP.

60. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation, wherein said polymer is polystyrene and said metal-ligand complex is Er(TPP)TP.

61. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation, wherein said polymer is

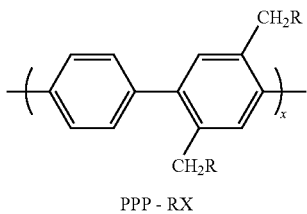

PPP - RX and wherein R is selected from the group consisting of alkyl, alkyl ether, oligoether, alkyl sulfonate, and alkyl amine, and wherein X is equal to or greater than one.

62. The composition of matter according to claim 61, wherein the metal containing compound is a metal organic compound.

63. The composition of matter according to claim 61, wherein the metal of said metal-ligand complex is a lanthanide selected from the group consisting of ytterbium, neodymium, holmium, praseodymium, erbium, and thulium.

64. The composition of matter according to claim 61, wherein the ligand of said metal-ligand complex is a light absorbing organic compound.

65. The composition of matter according to claim 61, wherein the ligand of said metal-ligand complex is a macrocyclic chelator.

66. The composition of matter according to claim 61, wherein the ligand of said metal-ligand complex is selected from the group consisting of 5,10,15,20-tetraphenylporphyrin, octaethyl porphyrin, chlorophyll, bacteriochlorophyl, chlorin, bacteriochlorphyl, chlorin, pentapyrrole macrocycle, tetraaryl porphyrin, octaalkyl porphyrin, tetrapyrroler macrocycle, and textphyrin.

67. The composition of matter according to claim 61, wherein said metal-ligand complex is an oxomolybdenum (IV) complex.

68. The composition of matter according to claim 61, wherein said metal-ligand complex is a structure selected from the group consisting of:

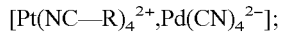

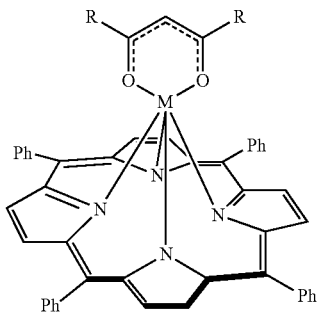

wherein M is chosen from Yb, Tm, Er, and Ho, R is chosen from Me, Ph, and Napthyl;

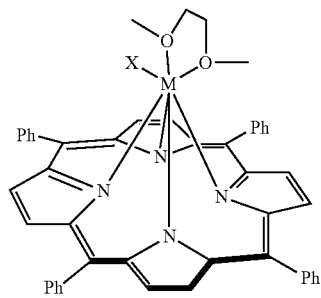

wherein M is chosen from Yb, Tm, Er, and Ho, and X is Cl, or M is Nd and X is I;

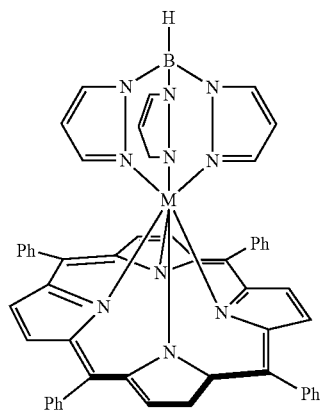

wherein M is chosen from Yb, Tm, Er, Nd, and Ho;

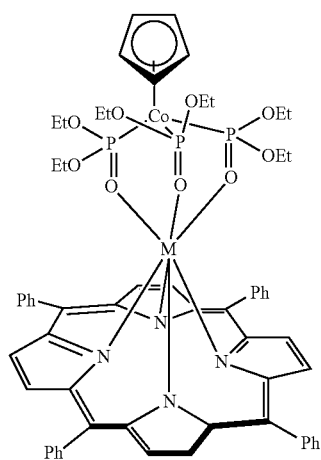

M = Yb, Tm, Er, Ho wherein M is chosen from Yb, Tm, Er, and Ho;

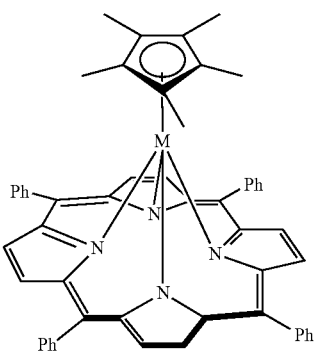

wherein M is chosen from Yb and Er; and

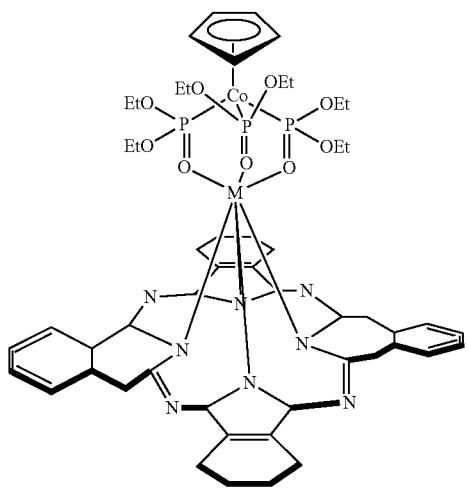

wherein M is chosen from Tm, Ho, and Er.

69. A composition of matter, comprising:
a polymer, wherein the polymer is a luminescent polymer, wherein the polymer has the characteristic of becoming electronically excited upon exposure of the polymer to photons, and
a metal containing compound, wherein the metal containing compound comprises a metal-ligand complex, wherein the metal ligand complex has the characteristic that when excited, energy is transferred from the ligand to the metal by sensitization, wherein the metal has the characteristic that when energy is transferred to the metal by sensitization the energy is emitted as near-infrared radiation,
wherein said polymer is

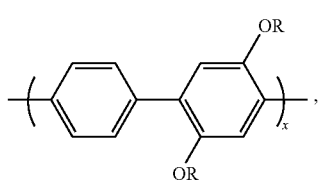

PPP - ORX wherein R is selected from the group consisting of alkyl, alkyl ether, oligoether, alkyl sulfonate, and alkyl amine, and wherein X is equal to or greater than one.

70. The composition of matter according to claim 69, wherein the metal containing compound is a metal organic compound.

71. The composition of matter according to claim 69, wherein the metal of said metal-ligand complex is a lanthanide selected from the group consisting of ytterbium, neodymium, holmium, praseodymium, erbium, and thulium.

72. The composition of matter according to claim 69, wherein the ligand of said metal-ligand complex is a light absorbing organic compound.

73. The composition of matter according to claim 69, wherein the ligand of said metal-ligand complex is a macrocyclic chelator.

74. The composition of matter according to claim 69, wherein the ligand of said metal-ligand complex is selected from the group consisting of 5,10,15,20-tetraphenylporphyrin, octaethyl porphyrin, chlorophyll, bacteriochlorophyl, chlorin, bacteriochlorphyl, chlorin, pentapyrrole macrocycle, tetraaryl porphyrin, octaalkyl porphyrin, tetrapyrroler macrocycle, and textphyrin.

75. The composition of matter according to claim 69, wherein said metal-ligand complex is an oxomolybdenum (IV) complex.

76. The composition of matter according to claim 69, wherein said metal-ligand complex is a structure selected from the group consisting of:

$[Pt(NC\text{---}R)_4^{2+}, Pd(CN)_4^{2-}]$;

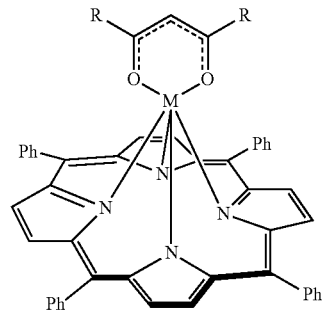

wherein M is chosen from Yb, Tm, Er, and Ho, R is chosen from Me, Ph, and Napthyl;

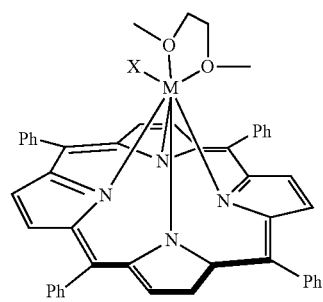

wherein M is chosen from Yb, Tm, Er, and Ho, and X is Cl, or M is Nd and X is I;

21
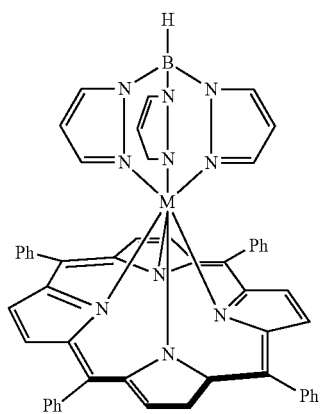
wherein M is chosen from Yb, Tm, Er, Nd, and Ho;
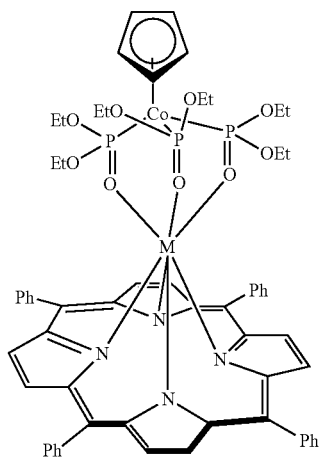
M = Yb, Tm, Er, Ho
wherein M is chosen from Yb, Tm, Er, and Ho;
22
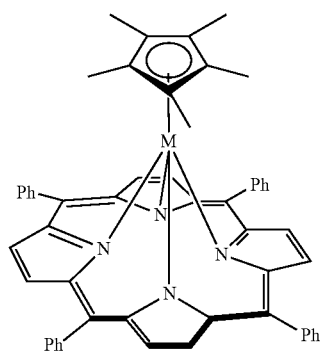
wherein M is chosen from Yb and Er; and
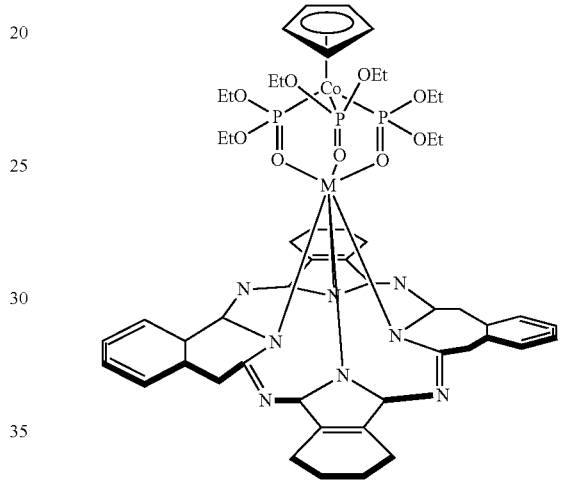
wherein M is chosen from Tm, Ho, and Er.
\* \* \* \* \*